(12) United States Patent
King et al.

(10) Patent No.: US 10,191,088 B2
(45) Date of Patent: Jan. 29, 2019

(54) INTERCONNECT SENSOR PLATFORM WITH ENERGY HARVESTING

(71) Applicant: TE CONNECTIVITY CORPORATION, Berwyn, PA (US)

(72) Inventors: Alexander Raymond King, Lancaster, PA (US); Mohammad Siddique Ahmed, Mechanicsburg, PA (US); Raymond Howard Kohler, Souderton, PA (US); Ganesh Shivaram Bhatt, Dallastown, PA (US); Robert Joseph Baragona, Hummelstown, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 220 days.

(21) Appl. No.: 14/992,626

(22) Filed: Jan. 11, 2016

(65) Prior Publication Data

US 2017/0199229 A1    Jul. 13, 2017

(51) Int. Cl.
*H02J 3/32*         (2006.01)
*G01R 15/18*        (2006.01)
(Continued)

(52) U.S. Cl.
CPC ......... *G01R 15/18* (2013.01); *G01R 19/0092* (2013.01); *H01R 13/6683* (2013.01); *H01R 13/6691* (2013.01); *H02J 5/005* (2013.01); *H02J 7/34* (2013.01); *H02J 7/35* (2013.01); *H02J 13/0006* (2013.01); *H02J 50/10* (2016.02); *Y02B 90/226* (2013.01); *Y02E 60/74* (2013.01); *Y04S 10/30* (2013.01); *Y04S 20/16* (2013.01)

(58) Field of Classification Search
CPC ................ H05B 37/272; H05B 33/854; G06F 17/30864
See application file for complete search history.

(56) References Cited

U.S. PATENT DOCUMENTS

2011/0248846 A1* 10/2011 Belov ...................... H04Q 9/00
                                                      340/539.1
2012/0296567 A1* 11/2012 Breed .................... G01C 21/26
                                                        701/468
(Continued)

FOREIGN PATENT DOCUMENTS

CA        2934823 A1    7/2015

OTHER PUBLICATIONS

International Search Report, International Application No. PCT/US2017/050058, International Filing Date, Jan. 6, 2017.

*Primary Examiner* — Sibin Chen

(57) ABSTRACT

An interconnect device includes a body portion with conductors passing through the body portion. An energy harvesting device, a power controller device and a rechargeable DC power source are configured such that the power controller device includes instructions programmed thereon for controlling the flow of power between the energy harvesting device, the DC power source, and a microcontroller. Sensor devices are in electrical communication with the microcontroller. The sensors are arranged to detect parameters associated with the interconnect device and communicate the parameters to the microcontroller. An output device communicates data from the microcontroller associated with the at least one sensor.

14 Claims, 2 Drawing Sheets

(51) Int. Cl.
*H02J 7/35* (2006.01)
*H02J 7/34* (2006.01)
*H02J 5/00* (2016.01)
*G01R 19/00* (2006.01)
*H01R 13/66* (2006.01)
*H02J 13/00* (2006.01)
*H02J 50/10* (2016.01)

(56) References Cited

U.S. PATENT DOCUMENTS

2013/0250102 A1   9/2013  Scanlon et al.
2014/0062669 A1*  3/2014  Mena ...................... G06F 17/40
                                                        340/10.5
2014/0203638 A1   7/2014  Keswani et al.

* cited by examiner

US 10,191,088 B2

INTERCONNECT SENSOR PLATFORM WITH ENERGY HARVESTING

FIELD OF THE INVENTION

The present invention is directed to interconnect devices, and more specifically to an interconnect sensor platform with energy harvesting.

BACKGROUND OF THE INVENTION

Current state of the art for sensor technology related to interconnects requires independent sensor assemblies with independent power source for powering sensor assembly. These sensor assemblies are deployed externally to the interconnect and observe the characteristics of the interconnect.

Independent sensor assemblies are often modular in nature, requiring the installation of separate modules for each function including sensing elements, power supply units, communication channels, and battery backups.

Independent sensor assemblies require dedicated communication channels to report sensor data, with additional communication wires adding to clutter in areas of deployment.

Electrical connectors or interconnect devices are used for a wide variety of circuit application, e.g., power systems, data and networking systems, lighting, communications, fiber optics, and the like. Each application may have different operating parameters and characteristics that may be monitored to provide useful information, such as temperature, current, signal direction, and connector mating state. Generally interconnect devices do not include such sensing capabilities unless additional independent sensor assemblies are attached to the interconnect device and a separate power source is available to provide power to the discrete attachments.

What is needed is an interconnect device that integrates sensing capabilities—including current, temperature, signal direction, mating status—within the body of the interconnect device, without having to include additional connections for sensor power or data communication.

SUMMARY OF THE INVENTION

In one embodiment an interconnect device is disclosed. The interconnect device includes a body portion with conductors passing through the body portion. An energy harvesting device, a power system controller device and a rechargeable DC power source (e.g. battery) are integrated into the body of the interconnect and configured such that the power system controller device controls the flow of power between the energy harvesting device, the DC power source, and a microcontroller. Sensor devices interface with the microcontroller. The sensors are arranged to detect parameters associated with the interconnect device and these parameters are read by the microcontroller. A communications channel allows the transmission of sensor data from at least one sensor by the microcontroller to a nearby monitoring system.

In another embodiment a smart interconnect device includes an independent power mode controller having programmed software in memory for managing a power flow between a first power source, a second power source and a load. The first power source may be an energy harvesting circuit. The second power source may be a rechargeable DC battery; and the load includes a microcontroller connected to a plurality of sensing elements and an output element. The power mode controller, the first power source, the second power source, the microcontroller, the sensing elements and the output element are miniaturized components housed within the interconnect device.

One advantage of the disclosed interconnect sensor platform is integrated sensing capabilities—including but not limited to electrical current, temperature, and signal direction—are provided within the body of the interconnect device, without additional connections for power or data communication.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
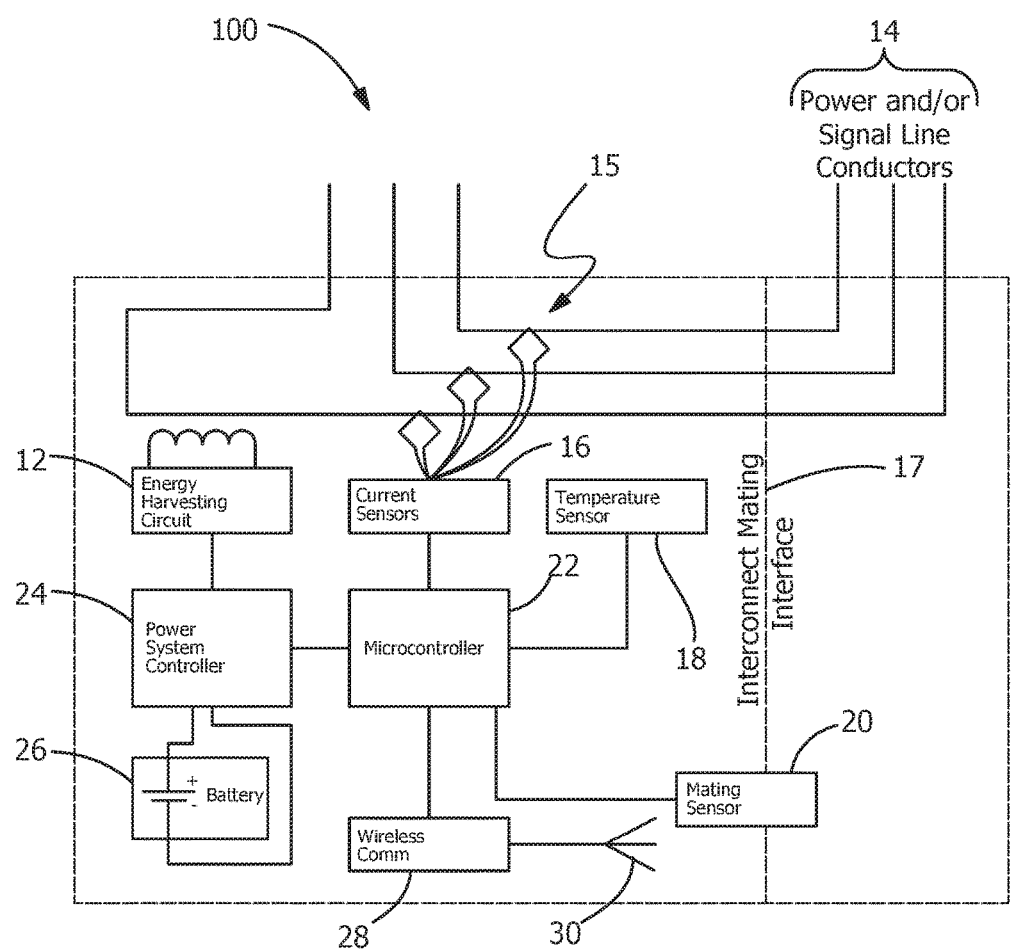
FIG. 1 shows a schematic diagram of an interconnect device with an energy harvesting circuit and sensing elements.
Figure 2:
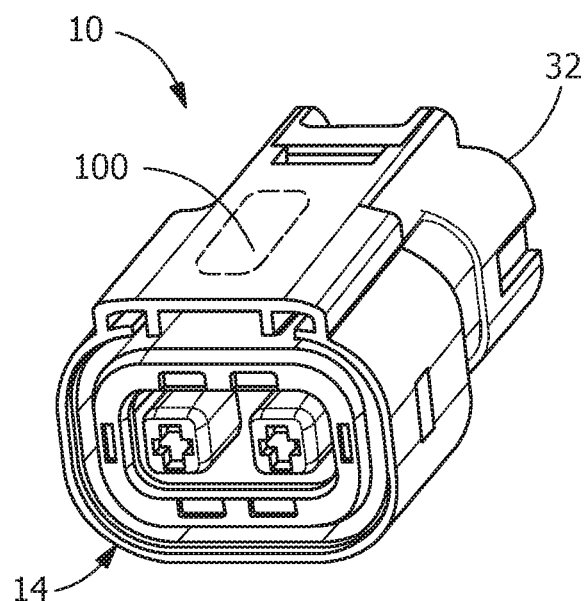
FIGS. 2 and 3 show front views, respectively, of an interconnect device including the circuit of FIG. 1.
Figure 3:
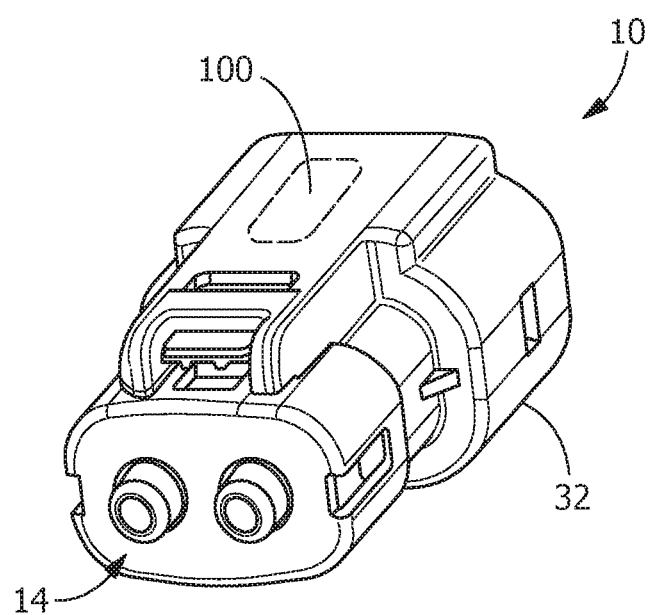

Referring to FIG. 1 an exemplary circuit 100 for an interconnect device 10 (FIGS. 2 & 3) is shown. Device 10 provides a smart connector platform with a platform-independent power mode controller implemented in firmware. An energy harvesting circuit 12 may be inductively coupled to power or signal line conductors 14 of device 10. The energy harvesting circuit 12 may include an inductor which is electromagnetically coupled to the conductors. Alternately, energy harvesting circuit 12 may derive power independent of the power and signal conductors, such as a mechanical motion energy harvester that converts mechanical energy, such as vibrations, into electrical energy; a photovoltaic device that converts light energy to electrical energy; an electromagnetic energy harvesting device; and other energy harvesting methods and devices known to persons of skill in the art.

Energy harvesting circuit 12 powers a power system controller 24, and provides charging energy to a DC power source, such as, but not limited to, a rechargeable battery 26. The power controller 24 includes instructions programmed thereon or implemented in the integrated circuit for controlling a flow of power between the energy harvesting device 12, the DC power source 26, and a microcontroller 22. Power system controller 24 provides power to the microcontroller 22 or other programmable processor, and manages the flow of power between energy harvesting circuit 12 and battery 26. When energy harvesting circuit 12 generates excess power over the microcontroller load, the excess power is applied to battery 26 to restore power dissipated from the battery during peak load times or when energy harvesting circuit 12 is not generating sufficient power for microcontroller 22.

Device 10 applies miniaturized sensing circuits inside the body of a traditional interconnect device. Sensing circuits may include current sensor or sensors 16, a temperature sensor 18, and conductor mating sensor 20. Sensors 16, 18, 20 generate signals indicative of the sensed parameter levels and inputs the sensor signals to microcontroller 22. E.g., current sensor 16 may sense the electrical current in one or more of the conductors 14, via current transformers 15; temperature sensor 18 may measure the temperature of the connector body 32; and mating sensor 20 may detect that the interconnect device 10 is properly mated with a compatible interconnect device to ensure continuity of conductors 14.

Microcontroller 22 includes data memory which stores data provided by sensors 16, 18, 20 and transmits the sensor data to a server or compatible device (not shown) via an output communication channel for communicating data, such as, but not limited to, a wireless communication device 28 having an RF antenna 30. All of the components of the energy harvesting circuit 12, power system controller 24, battery 26, sensors 16, 18, 20, microcontroller 22, wireless communications device 28 and antenna 30 are integrated into the body 32 of the interconnect device 10, an output communication channel for communicating data from the microcontroller associated with at least one sensor.

Energy harvesting circuit 12 provides power to drive sensor, analysis, and communication capabilities of device 10. In one or more preferred embodiments miniaturization and integration of low-power wireless communication is implemented in order to transmit sensor data. Alternately, the interconnect device 10 may include an integrated miniature visual display (not shown) to indicate performance data received from the sensors. The interconnect device circuit provides a smart connector platform that includes a power mode controller that may be implemented in firmware with permanently programmed software in onboard memory, or as dedicated power system controller integrated circuit.

The integrated wireless communication device 28 may be used to provide data aggregation via a cloud storage gateway (not shown), using a communication gateway.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An electrical connector comprising:
   a housing;
   a plurality of power and signal line conductors passing through the housing;
   an energy harvesting device, a power controller device and a DC power source provided in the housing, the energy harvesting device inductively coupled to at least one of the plurality of power and signal line conductors, the at least one of the plurality of power and signal line conductors through the energy harvesting device providing energy to the power controller device and the DC power source;
   the power controller device having instructions programmed thereon or implemented in the integrated circuit for controlling a flow of power between the energy harvesting device, the DC power source, and a microcontroller;
   at least one sensor device in electrical communication with the microcontroller, the at least one sensor device provided in the housing and arranged to detect at least one parameter within the housing and communicate at least one parameter to the microcontroller; and
   an output communication channel provided in the housing for communicating data from the microcontroller associated with at least one sensor device.

2. The electrical connector of claim 1, wherein the at least one sensor device comprises:
   a current sensor, a temperature sensor, or a conductor mating sensor.

3. The electrical connector of claim 1, wherein the at least one sensor device generate sensor signals indicative of the at least one sensed parameter and inputs the sensor signals to the microcontroller.

4. The electrical connector of claim 1, wherein the microcontroller further comprises a data memory and the microcontroller stores the sensor signals in a data format.

5. The electrical connector of claim 1, wherein the output communication channel comprises a wireless communication device and an RF antenna element; and the microcontroller transmits the data to a server or compatible device via the wireless communication device via the RF antenna element.

6. The electrical connector of claim 1, wherein the at least one sensor device comprises a miniaturized sensing circuit disposed inside the housing of the electrical connector.

7. The electrical connector of claim 3, wherein the power controller device receives power from the energy harvesting device and provides the power to drive the microcontroller, wherein the microcontroller is programmed to receive, process and communicate the data from the sensor signals received from the at least one sensor device.

8. The electrical connector of claim 1, wherein the energy harvesting device, the power controller device, the rechargeable DC power source, the microcontroller, at least one sensor device and the output device are miniaturized to provide low-power wireless communication to transmit the data.

9. The electrical connector of claim 1, wherein the energy harvesting device comprises an inductor, the inductor electromagnetically coupled to the conductors.

10. The electrical connector of claim 1, wherein the output communication channel comprises a miniature visual display to display the data from the microcontroller associated with at least one sensor device.

11. A smart electrical connector comprising:
   a housing having a plurality of power and signal line conductors positioned therein;
   an independent power mode controller having programmed software in a memory for managing a power flow between a first power source, a second power source and a load;
   the first power source comprising an energy harvesting circuit inductively coupled to at least one of the plurality of power and signal line conductors;
   the second power source comprising a rechargeable DC battery;
   at least one of the plurality of power and signal line conductors through the energy harvesting device providing energy to the power mode controller and the rechargeable DC battery and
   the load comprising a microcontroller connected to a plurality of sensing elements and an output element;
   wherein the power mode controller, the first power source, the second power source, the microcontroller, the sensing elements and the output element comprise miniaturized components housed within the housing of the electrical connector.

12. The system of claim 11, wherein the at least one of the plurality of sensing elements comprises a current sensor, a temperature sensor, or a conductor mating sensor.

13. The system of claim 11, wherein the output element comprises a wireless communication device and an RF antenna element; and the microcontroller transmits data received from the plurality of sensing elements to a server via the wireless communication device via the RF antenna element.

14. The system of claim 11, wherein the output element comprises a miniature video display to display data received from the plurality of sensing elements.

* * * * *